United States Patent
Sekiguchi et al.

(10) Patent No.: US 6,721,194 B2
(45) Date of Patent: Apr. 13, 2004

(54) SEMICONDUCTOR MEMORY

(75) Inventors: Tomonori Sekiguchi, Zurich (CH); Riichiro Takemura, Tokyo (JP); Takeshi Sakata, Hino (JP); Kazushige Ayukawa, Kokubunji (JP); Takayuki Kawahara, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/287,678

(22) Filed: Nov. 5, 2002

(65) Prior Publication Data

US 2003/0086288 A1 May 8, 2003

(30) Foreign Application Priority Data

Nov. 5, 2001 (JP) .................................. P2001-338938

(51) Int. Cl.[7] .......................... G11C 15/00; G11C 11/24; G11C 8/00
(52) U.S. Cl. ..................... 365/49; 365/149; 365/230.03
(58) Field of Search ...................... 365/49, 149, 230.03

(56) References Cited

U.S. PATENT DOCUMENTS

| 5,050,126 A | * | 9/1991 | Tanaka et al. | ......... 365/230.03 |
| 5,371,711 A | * | 12/1994 | Nakayama | ............. 365/230.03 |
| 5,592,407 A | * | 1/1997 | Konishi et al. | ............... 365/49 |
| 6,075,735 A |   | 6/2000 | Sugibayashi | ........... 365/189.11 |
| 6,414,893 B1 | * | 7/2002 | Miyamoto | ................... 365/49 |

FOREIGN PATENT DOCUMENTS

| JP | 11-110967 | 10/1997 |
| JP | 2002-93158 | 9/2000 |

OTHER PUBLICATIONS

Satoshi Utsugi, Masami Hanyu, Yoshinori Muramatsu and Tadahiko Sugibayashi, "Noncomplimentary Rewriting and Serial–Data Coding Scheme for Shared–Sense–Amplifier Open–Bit–Line DRAM", IEEE Journal of Solid–State Circuits, vol. 34, No. 10, Oct. 1999, pp. 1391–1394.

* cited by examiner

Primary Examiner—Trong Phan
(74) Attorney, Agent, or Firm—Reed Smith LLP; Stanley P. Fisher, Esq.; Juan Carlos A. Marquez, Esq.

(57) ABSTRACT

A DRAM adopting a single-intersection memory cell array having randomly accessible data registers accessed whenever the chip is accessed externally. When data items recorded in the data registers are simultaneously written in the memory cell array, the data items are encoded. When data items are read from the memory cell array into the data registers, the data items are decoded. The margin is enhanced because array noise derived from reading is reduced. In addition, the access time of the DRAM is also reduced.

20 Claims, 10 Drawing Sheets

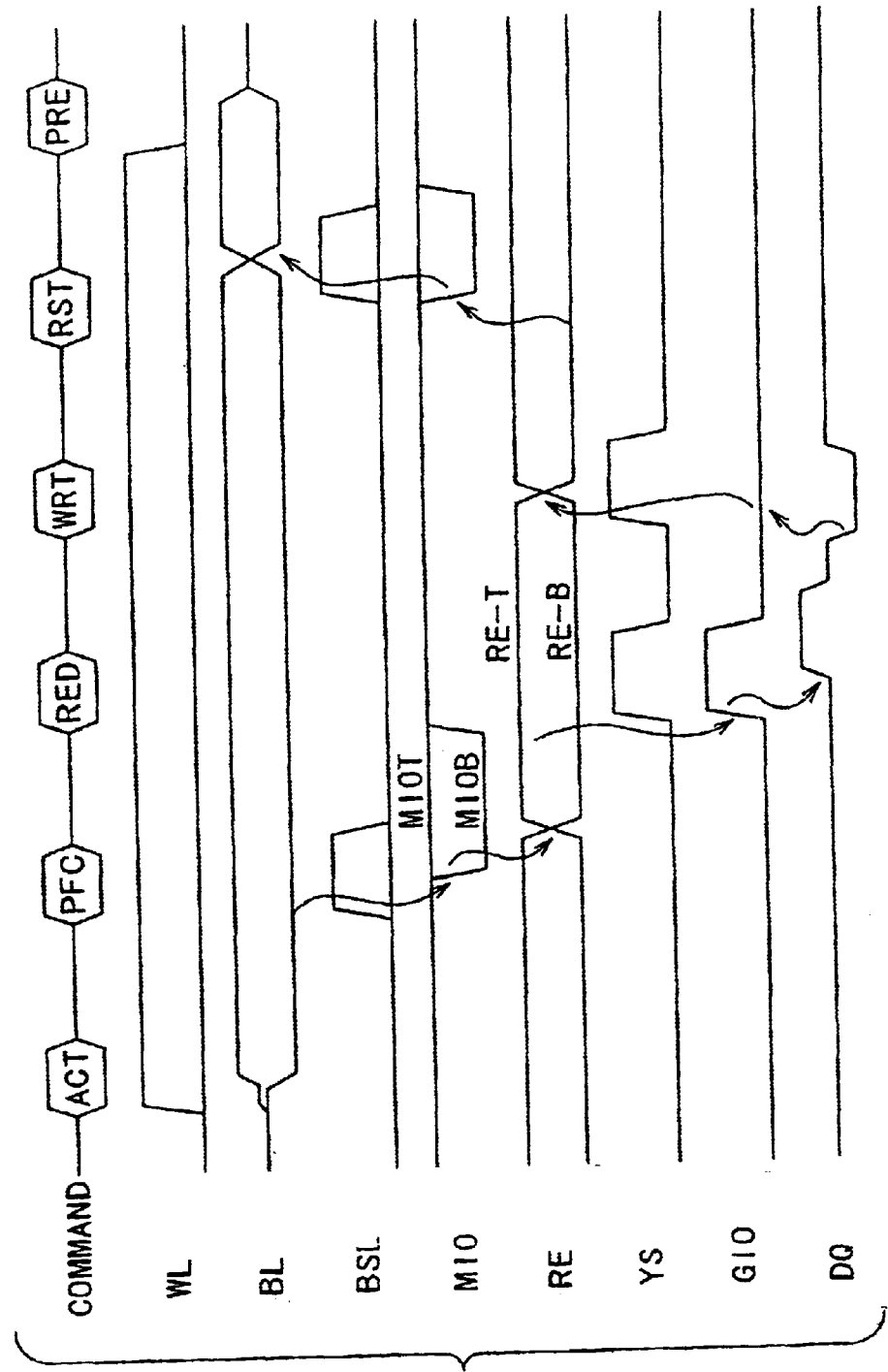

SEMICONDUCTOR MEMORY

BACKGROUND OF THE INVENTION

1. Field of the Invention

The present invention relates to a semiconductor memory, and more particularly, to a dynamic random access memory (DRAM) whose margin can be expanded by minimizing noise occurring in a memory cell array comprising single-intersection memory cells.

2. Description of the Related Art

DRAMs are generally used to reduce the area of a chip and hence minimize the manufacturing costs thereof. FIG. 9A shows a single-intersection memory cell array having memory cells connected at all intersections of word lines WL (WL0, WL1, WL2) and bit lines BL (BL0B, BL0T, BL1B, BL1T, BL2B, BL2T). Compared with known dual-intersection memory cell arrays having memory cells connected at only half of the intersections of word and bit lines, the area occupied by the single-intersection memory cell array can be reduced by 25%. Referring to FIG. 9A, there are shown sense amplifiers SA0, SA1, SA2, etc.

However, compared with the dual-intersection memory cell array, the single-intersection memory cell array has a drawback that the array noise increases during data reading. This obstructs practical use of the single-intersection memory cell array.

Moreover, even in the dual-intersection memory cell array, when a difference between capacitance levels of two parasitic capacitors formed between complementary bit lines and a word line gets so large that the noise cannot be canceled, the problem of increasing array noise persists.

FIG. 9B shows the waveforms associated with the occurrence of one form of array noise comprising word line noise. FIG. 9B is illustrative of the case where the word line WL0 is activated, high-level data is read and placed on the bit line BL1T, and low-level data is read and placed on bit lines BL0T and BL2T.

Where the amount of intelligence on the bit line BL1T has substantially decreased due to current leakage or any other reason, the signals with a large amount of intelligence on the bit lines BL0 and BL2 are amplified first. As indicated by dotted arrows in FIG. 9A, a potential difference between the bit line BL0 (BL0T, BL0B) or BL2 (BL2T, BL2B) and the bit line BL1 (BL1T, BL1B) brings about a potential difference between the word line WL0 and an adjoining one WL1, WL2 or WL3 due to a parasitic capacitor CBLWL formed between a bit line and word line. The potential difference returns to the bit line BL1 via the parasitic capacitor CBLWL.

The amount of intelligence on the bit line BL1 is so small that the signal is amplified slowly. If the amount of intelligence decreases because of an accompanying noise, the signal may be inverted incorrectly. A similar noise occurs because of a plate that is a counter electrode of a capacitor included in a memory cell or a substrate of a transistor included in the memory cell. Therefore, in order to put the single-intersection memory cell array to practical use, it is mandatory to minimize the array noise.

Referring to the pair of bit lines BL1T and BL1B, the array noise becomes the largest in the case where high-level data items (defined as 1s) or low-level data items (defined as 0s) are read onto all side-T bit lines BL0T, BL2T, etc.

FIG. 10 shows the configuration of a semiconductor memory in accordance with the related art in which the pattern of data items to be written in memory cells is encoded in order to reduce the array noise. Similar methods of reducing the array noise are described in, for example, JP-A No. 110967/1999 and the IEEE journal "Solid-state Circuits" (Vol. 34, No. 10, October 1999, pp.1391–1394).

In the semiconductor memory of the related art, bits are received in sequence via an input/output buffer IOB through input/output pins DQ. The bits are multiplexed by a multiplexer MUX and temporarily written in registers RE. At the same time, the number of bits received in sequence is counted using a burst counter BC. At this time, if the number of 1s occupies 25% or less or 75% or more, a flag FLG is set. This causes encoders EN to invert half of the bits. In this case, the number of bits constituting data placed on one word line WL is confined to the range from 25% to 75% of the number of received bits. Consequently, the array noise is reduced to 50% of the array noise occurring when received bits are 100% 1s or are 100% 0s. FIG. 10 shows memory cells MC, sense amplifiers SA, bit lines BL, and a decoder DEC, and a selection signal SEL.

However, in the semiconductor memory having encoders of the related art, a flag bit is needed for each of data blocks that are received in sequence. If the number of bits received in sequence is small, the number of flag memory cells included in a chip increases and undesirably increases chip size.

Further, the number of bits received in sequence through the input/output pins DQ is counted using the burst counter BC. It is then determined whether the flag FLG should be set. Such determination takes a long time to make and undesirably increases the time required for the memory cycle.

Moreover, the criterion that the number of 1s occupies 25% or less or 75% or more used in the semiconductor memory having encoders of the related art is so complex that it undesirably increases the circuit scale and the area of a chip.

SUMMARY OF THE INVENTION

According to at least one preferred embodiment of the present invention, a semiconductor memory is provided comprising a plurality of memory cells wherein each memory cell is connected at one of the plurality of intersections of one of a plurality of word lines and one of a plurality of bit lines; a one-bit flag memory cell included for each word line; a plurality of sense amplifiers associated with the plurality of bit lines; a plurality of randomly accessible data registers holding writable data; an encoding control circuit that determines the ratio of the number of 1s contained in the writable data to the number of 0s contained therein; and encoders that write writable data items in sense amplifiers as they are or after inverting them according to the result of the determination made by the encoding control circuit.

Whenever external access is made to the semiconductor memory, the data registers are also accessed. When data items read from the data registers are written simultaneously in the memory cell array, the data items are encoded. When data items are read from the memory cells into the data registers, a flag is referenced in order to decode the data items. The encoders and encoding control circuit of the semiconductor memory are designed to perform these actions. Consequently, the array noise occurring during reading is minimized and the margin is maximized. The access time and size of the chip including the semiconductor memory are also minimized.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 2 shows waveforms relevant to functions performed in the semiconductor memory of the present invention;

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description of a semiconductor memory in accordance with the present invention will be provided herein below with reference to the attached drawings.

First Exemplary Embodiment

Figure 1A:
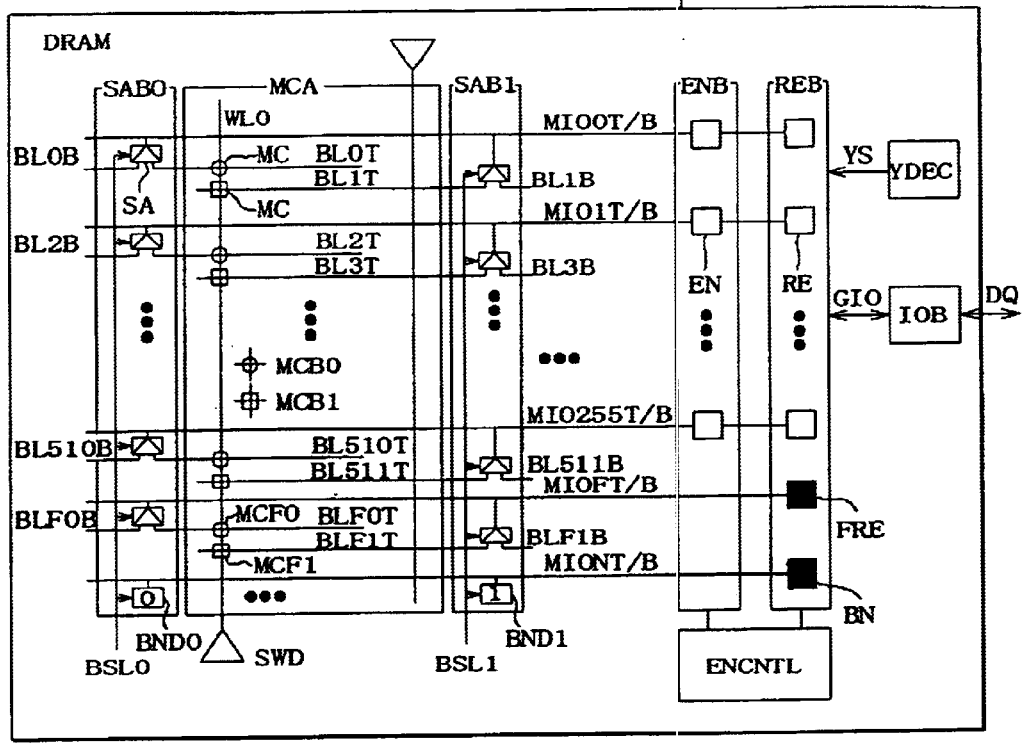
FIG. 1A shows the circuitry of a semiconductor memory of the present invention.

FIG. 1A shows the circuitry of a low-noise encoding DRAM of a semiconductor memory of a first preferred embodiment of the present invention. FIG. 2 shows the waveforms relevant to the functions performed therein. In the semiconductor chip incorporating the low-noise encoding DRAM 10 of the present invention, an Activate command ACT is issued when data items are to be read or written. The data items stored in memory cells MC constituting a memory cell array MCA are read and held in sense amplifiers SA belonging to sense amplifier banks SAB0 and SAB1.

After the pre-charging of the sense amplifiers SA is terminated, a sub-word driver SWD activates the word line WL0 so as to read data items from the memory cells MC onto bit lines BL0T, BL1T . . . BL510T, BL511T, etc. The sense amplifiers SA amplify the differences between weak signals developed on the bit lines and reference potentials on side-B bit lines BL0B, BL1B . . . BL510B, BL511B, etc., and hold the results.

As shown in FIG. 1A, the memory cells interconnected over one word line are classified into two groups. One of the two groups has data items thereof amplified by the left-hand sense amplifier bank SAB0, and the memory cells belonging to this group are indicated with circle marks. The other group has data items thereof amplified by the right-hand sense amplifier bank SAB1, and the memory cells belonging to this group are indicated with square marks.

A Pre-fetch command PFC is then issued, whereby the data items in the sense amplifiers SA are transferred to data registers RE over main input/output lines MIO. At this time, either of the groups of memory cells MCB0 and MCB1 is selected based on a group selecting signal BSL (BSL0, BSL1), and the data items held in the selected bank are transferred simultaneously to the data registers RE. When the data items are written in the registers RE over the main input/output lines, encoders EN constituting an encoder bank ENB decode the data items as described below.

The main input/output lines are pre-charged to a high level while they are on standby and include complementary signal lines MIOT and MIOB for the purpose of high-rate transfer. During data transfer, either of the main input/output lines MIOT and MIOB is driven low. Throughout the drawings and specification hereof as shown in FIG. 1A, complementary main input/output lines, such as the main input/output lines MIOT and MIOB, are referred to as MIOT/B. This same notation applies to the other complementary signal lines as well. The number of main input/output lines MIO0T–MIO255T is 256, and the number of main input/output lines MIO0B–MIO255B is 256.

Prior to data transfer, during pre-fetching, the sense amplifier connected onto the flag bit line BLF0T/B transfers a flag to a flag register FRE over a main input/output line MIOFT/B. Moreover, either of group number drivers BND0 and BND1 transfers a 0 or 1, which represents a group number, to a group number register BN over a main input/output line MIONT/B.

External data transfer to or from the DRAM of the present invention is achieved via the data registers RE. When a Read command RED or a write command WRT is issued, addresses in the register bank REB are successively designated by a column decoder YDEC over column selection lines YS. In the case of reading, data items recorded in the data registers RE are transferred over a global input/output line GIO and applied to the input/output pins DQ via the input/output buffer IOB. In the case of writing, data items received through the input/output pins DQ are transferred via a path reverse to the reading path described immediately above and written in the data registers RE.

After the requested reading or writing of the data items from or into the data registers RE is completed, a Restore command RST is issued to rewrite the data items from the data registers RE to the memory cell array MCA. The data items in the data registers RE are transferred over the main input/output lines MIO and written in the sense amplifiers SA. At the same time, the data items are written in the memory cells interconnected over the selected word line by way of the bit lines. Finally, a Pre-charge command PRE is issued in order to reset the word line and pre-charge the bit lines.

During the foregoing pre-fetching or restoring, data items recorded in the same group of memory cells are transferred simultaneously between the sense amplifiers SA and data registers RE. In the instant example, the memory cell array is divided into two groups MCB0 and MCB1. Alternatively, the memory cell array may be divided into a larger number of groups in order to reduce the amount of data to be transferred between the sense amplifiers and data registers. In this case, the number of main input/output lines can also be decreased.

In the low-noise encoding DRAM of this first exemplary present embodiment, the encoder bank ENB is preferably interposed between the data register bank REB and sense amplifier bank SAB in order to encode data items to be written in the sense amplifiers or the memory cells. Consequently, the array noise occurring when the memory cell array is activated is reduced.

When data items RE-T and RE-B are read from the data registers RE into the sense amplifiers SA during restoring, the number of 0s among all the bits of data items stored in the group of memory cells MCB0 is normally larger than the number of 1s. If, however, the number of 1s wins a majority, a 1 is written in the flag register FRE in order to invert the data items. The encoding is realized when the encoder bank ENB inverts values written in the data registers RE and transfers the resultant values to the sense amplifiers SA over the main input/output lines MIO. When the number of 1s is one-half or less than one-half of the sum total of bits, the values in the data registers RE are not inverted but transferred to the sense amplifiers SA as they are.

In contrast, the number of 1s in the group of memory cells MCB1 is normally larger than the number of 0s. If, however, the number of 0s wins a majority, a 1 is written in the flag register FRE and the data items are then inverted. The flag FRE is needed for decoding to be performed during pre-fetching during which data items are read from the memory cells MC into the data registers RE. Flag memory cells MCF0 and MCF1 are therefore included for each word line. During restoring, the flag recorded in the flag register FRE is written in the flag memory cell MCF0 or MCF1. Even in this case, if the number of 0s is one-half or less than one-half of the sum total of bits, a 0 is held in the flag register FRE. Values are not inverted but transferred to the data registers RE as they are. The values are then transferred to the sense amplifiers SA.

As shown in FIG. 1A, the memory cells interconnected over one word line are classified into two groups. However, even when the memory cells are classified into two or more groups, the encoding method of the present embodiment can still be employed in the same manner as described above. In such case, a plurality of groups may be grouped into two assemblages so that the number of bits stored in one assemblage will be nearly equal to the number of bits stored in the other. Data items stored in a group belonging to one assemblage are encoded so that the number of 0s will normally comprises a majority, and data items stored in a group belonging to the other assemblage is encoded so that the number of 1s normally comprises a majority. FIG. 1A shows an encoding control circuit ENCNTL described below.

Figure 1B:
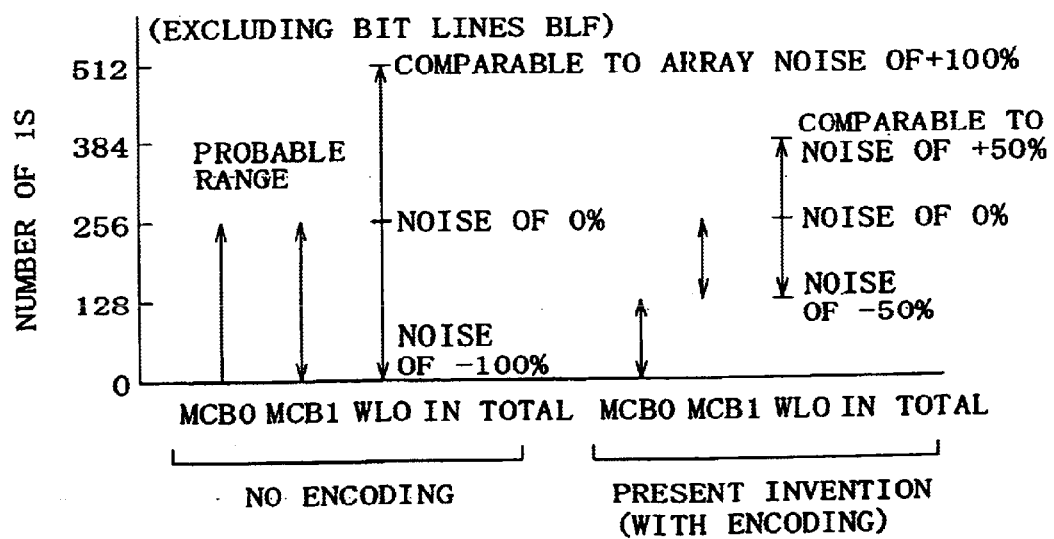
FIG. 1B is an explanatory diagram illustrating the reduction of array noise in the semiconductor memory of the present invention.

FIG. 1B shows the effect in minimizing the array noise that occurs in the encoding DRAM of this first preferred embodiment of the present invention. When encoding is not performed (NO ENCODING), 512 bits on the word lines WL0 (WL0 IN TOTAL) may be all 0s or 1s and results in the largest array noise (PROBABLE RANGE). The magnitudes of the array noises in the two states are nearly equal to each other and the polarities thereof are opposite to each other. The array noises in such states are defined as the array noises of 100% and −100%. Herein, the bit lines BLF over which the flag memory cells are interconnected are excluded.

In contrast, in the DRAM of the present invention (PRESENT INVENTION WITH ENCODING), the number of 1s in the group of memory cells MCB0 is 0 at minimum and 128 at maximum. The number of 1s in the group of memory cells MCB1 is 128 at minimum and 256 at maximum. The sum total of 1s on the word line WL0 (WL0 IN TOTAL) is therefore limited to a range from 128 to 384.

Herein, the polarity of a potential difference to be applied from a bit line, on which a signal representing a 1 is amplified, to a certain word line is opposite to the polarity of a potential difference to be applied from a bit line, on which a signal representing a 0 is amplified, to the word line. The potential differences are therefore canceled out. The noise occurring when the number of 1s is 384 and the number of 0s is 128 is equivalent to the noise caused by the movement of 256 bits, which is the difference between 384 and 128.

Consequently, compared to when all the 512 bits are 1s, the array noise is minimized nearly 50%. Likewise, the array noise occurring when the number of 1s is 128 and the number of 0s is 384 is minimized to about 50% of the array noise occurring when all the 512 bits are 0s. Even in the worst case, both the positive-polarity and negative-polarity array noises caused by word lines, a plate, or a substrate are reduced by about 50% in the DRAM of the present invention.

Figure 3A:
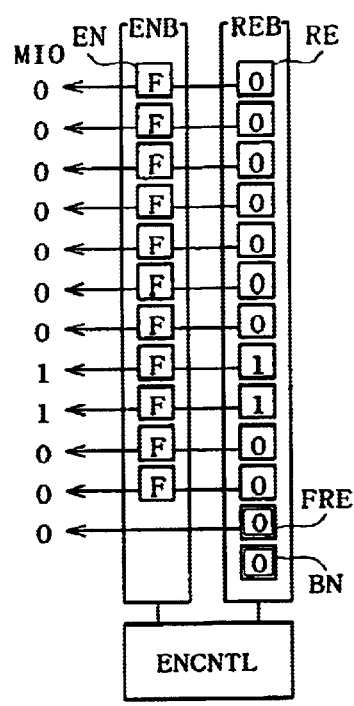
FIGS. 3A and 3B are schematic diagrams concerning the low-noise encoding that is performed according to the present invention during restoring.
Figure 3B:
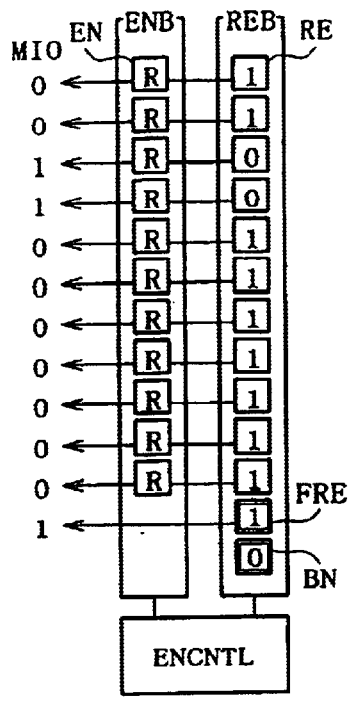

FIG. 3A and FIG. 3B show the states of the data register bank REB, data registers RE, encoder bank ENB, encoders EN, flag register FRE, and group number register BN attained during restoring (RST).

As shown in FIG. 3A, when the data items to be stored in the group of memory cells MCB0 are recorded in the data register bank REB, the flag recorded in the group number register BN is set to a 0. The encoding control circuit ENCNTL analyzes the data items in the data register bank REB. When the group number register BN holds a 0, if the number of 0s in the data register bank wins a majority, the flag recorded in the flag register FRE is set to a 0. The encoders EN are brought to a non-inverting state F and the data items in the data register RE are placed on the main input/output lines MIO as they are.

In short, when a 0 is recorded in the register BN, if the number of 0s in the registers RE is larger than the number of 1s therein, the flag recorded in the register FRE is set to a 0 and the encoders EN are set to the non-inverting state F.

In contrast, as shown in FIG. 3B, when the number of 1s in the data register bank REB wins a majority, the flag recorded in the flag register FRE is set to a 1. The encoders EN are brought to an inverting state R. At this time, the data items in the data register bank REB are inverted and placed on the main input/output lines MIO. When the data items to be stored in the group of memory cells MCB1 are held in the data registers RE, the flag recorded in the group number register BN is set to a 1. Contrary to the above description, when the number of 0s in the data registers RE wins a majority, the flag recorded in the flag register FRE is set to a 1. When the number of 1s wins a majority, the flag recorded in the flag register FRE is set to a 0.

In short, when a 0 is recorded in the register BN, if the number of 0s in the registers RE is smaller than the number of 1s therein, the flag recorded in the register FRE is set to a 1 and the encoders EN are set to the inverting state R.

Figure 3C:
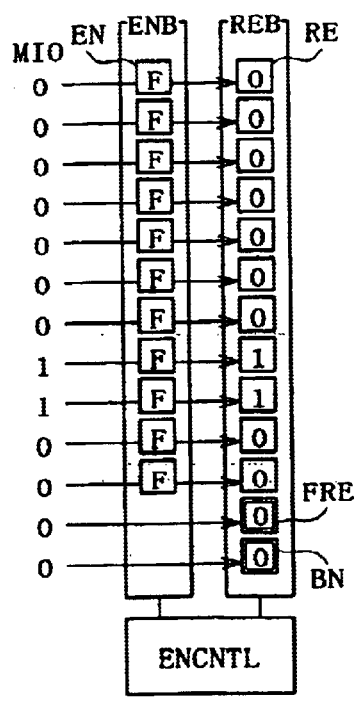
FIG. 3C and FIG. 3D are schematic diagrams concerning the low-noise encoding that is performed according to the present invention during pre-fetching.
Figure 3D:
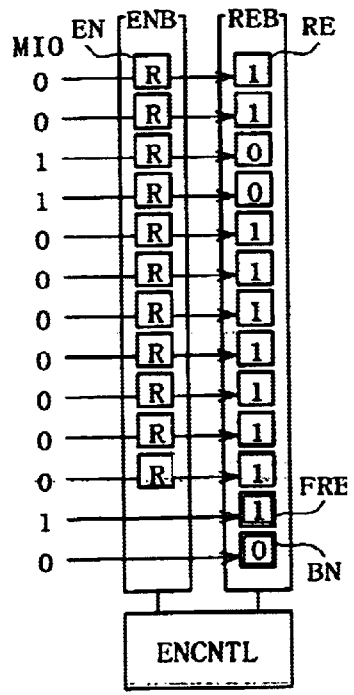

FIG. 3C and FIG. 3D show the states of the data register bank REB, data registers RE, encoder bank ENB, encoders EN, flag register FRE, and group number register BN attained during pre-fetching (PFC).

In order to pre-fetch data, the flag is read from a flag memory cell MCF included in the memory cell array MCA into the flag register FRE, and the group number is read from the group number driver BND to the group number register BN. The states of the encoders EN are determined based on the flag and group number. Thereafter, data items are read from the memory cell array MCA into the data registers RE.

As shown in FIG. 3C, when the flag recorded in the flag register FRE is set to a 0, the encoders EN are brought to the non inverting state F. The data items on the main input/output lines MIO are read into the data registers RE as they are. In contrast, as shown in FIG. 3D, when the flag recorded in the flag register FRE is set to a 1, the encoders EN are brought to the inverting state R. The data items on the main input/output lines MIO are inverted and read into the data registers RE. Consequently, data items encoded and written in memory cells are decoded according to the original pattern of external data items received and recorded in the data registers RE.

The encoding employed in this first preferred embodiment of the present invention requires the determination of whether the number of 1s wins a majority. The encoding employed in the present invention is simpler than the one employed in the related art which requires checking of whether the number of 1s occupies 25% or more or 75% or less. Consequently, the time required for encoding is reduced and the access time and memory cycle times are also reduced. Moreover, since the scale of each encoder is reduced, the area of the encoder can also be minimized.

Figure 4:
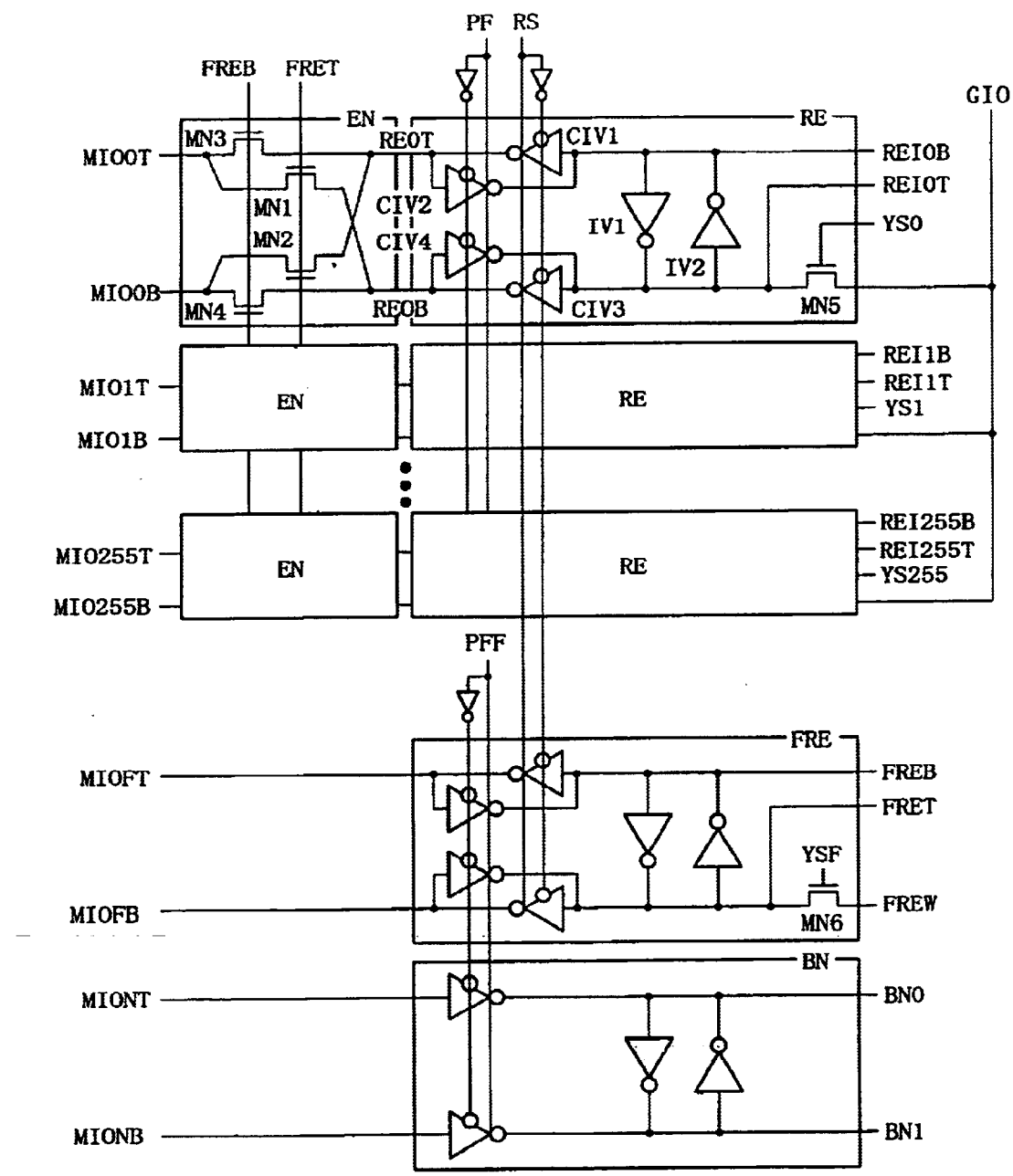
FIG. 4 is a partial circuit diagram showing a major portion of the encoder shown in FIG. 1A.

FIG. 4 shows the circuitry of an encoder employed in the first exemplary embodiment of the present invention. The encoder EN is mainly comprised of four NMOS transistors MN1, MN2, MN3 and MN4. The gates of the NMOS transistors MN1 and MN2 are connected to a side-T output node FRET of the flag register FRE shown in the lower part of FIG. 4. The gates of the NMOS transistors MN3 and MN4 are connected to a side-B output node FREB of the flag register FRE. The drain-source channel of the NMOS transistor MN1 is connected between a side-B output node RE0B of an associated data register RE and a side-T main input/output line MIO0T. The drain-source channel of the NMOS transistor MN2 is connected between a side-T output node RE0T of the data register RE and a side-B main input/output line MIO0B. The drain-source channel of the NMOS transistor MN3 is connected between the side-T output node RE0T of the data register RE and the side-T main input/output line MIO0T. The drain-source channel of the NMOS transistor MN4 is connected between the side-B output node RE0B of the data register RE and the side-B main input/output line MIO0B.

When the flag recorded in the flag register FRE is set to a 0, if the side-T output node FRET of the flag register is driven low and the side-B output node FREB is driven high, the encoder EN is brought to the non-inverting state. The side-T output node RE0T of the data register is connected onto the side-T main input/output line MIO0T, and the side-B node RE0B of the data register is connected onto the side-B main input/output line MIO0B. When the flag recorded in the flag register FRE is set to a 1, if the output node FRET is driven high and the output node FREB is driven low, the encoder EN is brought to the inverting state. The output node RE0T of the data register is connected onto the main input/output line MIO0B, and the output node RE0B of the data register is connected onto the main input/output line MIO0T. In FIG. 4, pass transistors of NMOS transistors alone are employed. Alternatively, an analog switch may be adopted wherein an NMOS transistor and PMOS transistor are connected in parallel with each other and the gates thereof are driven with complementary signals. This has the effect of speeding up the reading of and writing to the register.

The data register RE consists mainly of inverters IV1 and IV2 whose input/output terminals are connected to each other, and a bi-directional switch comprising clocked inverters CIV1 to CIV4. The clocked inverters CIV1 and CIV3 that are controlled with a restoring signal RS have the input terminals thereof connected to internal nodes REI0B and REI0T of the data register and have the output terminals thereof connected to the output nodes RE0T and RE0B thereof. The clocked inverters CIV2 and CIV4 that are controlled with a pre-fetching signal PF have the input terminals thereof connected to the output nodes RE0T and RE0B of the data register and have the output terminals thereof connected to the internal nodes REI0B, REI0T, REI1B, REI1T . . . REI255B, REI255T thereof. During pre-fetching, the pre-fetching signal is activated and data items on the main input/output lines MIO (MIO0T, MIO0B, MIO1T, MIO1B . . . MIO255T, MIO255B) are read into the data registers RE. During restoring, the restoring signal RS is activated, and data items in the data registers RE are written in the sense amplifiers SA over the main input/output lines MIO. Moreover, the data items are written in the memory cells MC, which are interconnected over a selected word line, by way of the bit lines.

In addition, the internal node REI0B of the data register is connected onto a global input/output line GIO via a column selecting switch NMOS transistor MN5. A column selection line YS (YS0, YS1 . . . YS255) is connected to the gate of the NMOS transistor MN5. During reading or writing, column selection lines YS associated with desired addresses are successively selected, and the data registers RE are successively connected onto the global input/output line GIO. Data items are then received or transmitted.

The flag register FRE has the same circuit elements as the data registers RE such as MIOFT, MIOFB, FREB, FRET and MN6. However, since the flag register FRE performs pre-fetching earlier than the data registers do, the flag register FRE has an independent input clock PFF. The group number register BN performs reading alone and, therefore, has an input switch alone, but does not have the clocked inverters CIV1 and CIV3 and column selecting switch NMOS transistor which are included in the flag register FRE. The output nodes are BN0, BN1, and BN is connected to main input/output lines MIONT and MIONB. As shown in FIG. 4, the NMOS transistor MN6 included in the flag register FRE is connected onto a terminal FREW over a flag column selection line YSF coupled to the gate thereof.

Figure 5:
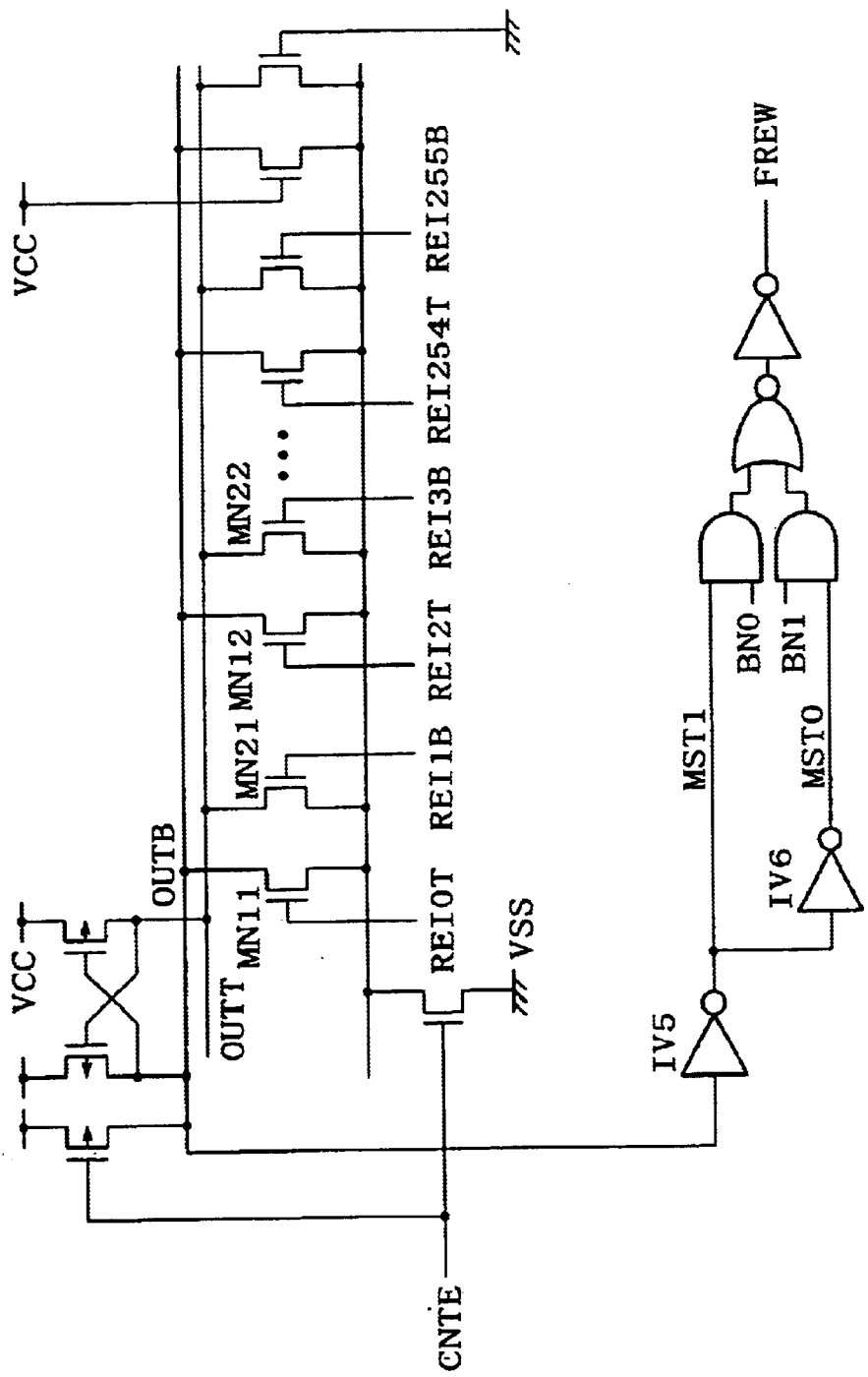
FIG. 5 is a partial circuit diagram showing a major portion of the encoding control circuit shown in FIG. 1A.

FIG. 5 shows the encoding control circuit ENCNTL included in this first exemplary embodiment of the present invention. This circuit is an analog counter that determines whether the number of 1s is larger than the number of 0s among all the bits in the data registers RE, and vice versa. Herein, the input transistors included in a differential amplifier are connected in parallel with each other. The side-T nodes RET0T, REI2T, etc. of the even-numbered data registers and a high-voltage power line VCC are connected to the gates of transistors MN11, MN12, etc. having the drains thereof connected in parallel with an output node OUTB. The side-B terminals REI1B, REI3B, etc. of the odd-numbered data registers and a low-voltage power line VSS are connected to the gates of transistors MN21, MN22, etc. having the drains thereof connected in parallel with an output node OUTT.

When a counter activating signal CNTE is activated, amplification is started. If the number of 1s among all the bits in the data registers is larger and the number of side-T nodes that are driven high is larger, the number of transistors connected to the output node OUTB and turned on is larger. Consequently, amplification is performed so that a voltage developed at the side-B output node OUTB will be lower than a voltage developed at the side-T output node OUTT. An output MST1 of an inverter IV5 is driven high, and an output MST0 of an inverter IV6 is driven low. At this time, when the group number register BN holds a 0, if one node BN0 of the register BN is driven high and the other node BN1 thereof is driven low, a high-level voltage is developed at the terminal FREW of the flag register. Consequently, a 1 is written in a flag memory cell. When the group number register BN holds a 1, if one node BN0 of the register BN is driven low and the other node BN1 thereof is driven high, a low-level voltage is developed at the terminal FREW of the flag register. Consequently, a 0 is written in the flag memory cell.

If the number of 0s among all the bits in the data registers RE is larger and the number of side-B nodes that are driven high is larger, the number of transistors connected to the side-T output node OUTT and turned on is larger. Consequently, amplification is achieved so that a voltage developed at the side-T output node OUTT will be lower than a voltage developed at the side-B output node OUTB. The output MST1 of the inverter IV5 is driven low and the output MST0 of the inverter IV6 is driven high. At this time, when the group number register BN holds a 0, if one node BN0 of the register BN is driven high and the other node BN1 thereof is driven low, a low level voltage is developed at the output terminal FREW of the flag register. Consequently, a 0 is written in the flag memory cell. When the group number register BN holds a 1, if one node BN0 of the register BN is driven low and the other node BN1 thereof is driven high, a high-level voltage is developed at the output terminal FREW of the flag register. Consequently, a 1 is written in the flag memory cell.

The encoding control circuit ENCNTL comprises an analog circuit in order to simultaneously check data items so as to determine the pattern of the data items. This obviates the need to check each of the bits in the registers and thus the pattern of data items can be analyzed quickly. Eventually, encoding can be achieved with only a slight increase to the access time or the memory cycle time.

Figure 6:
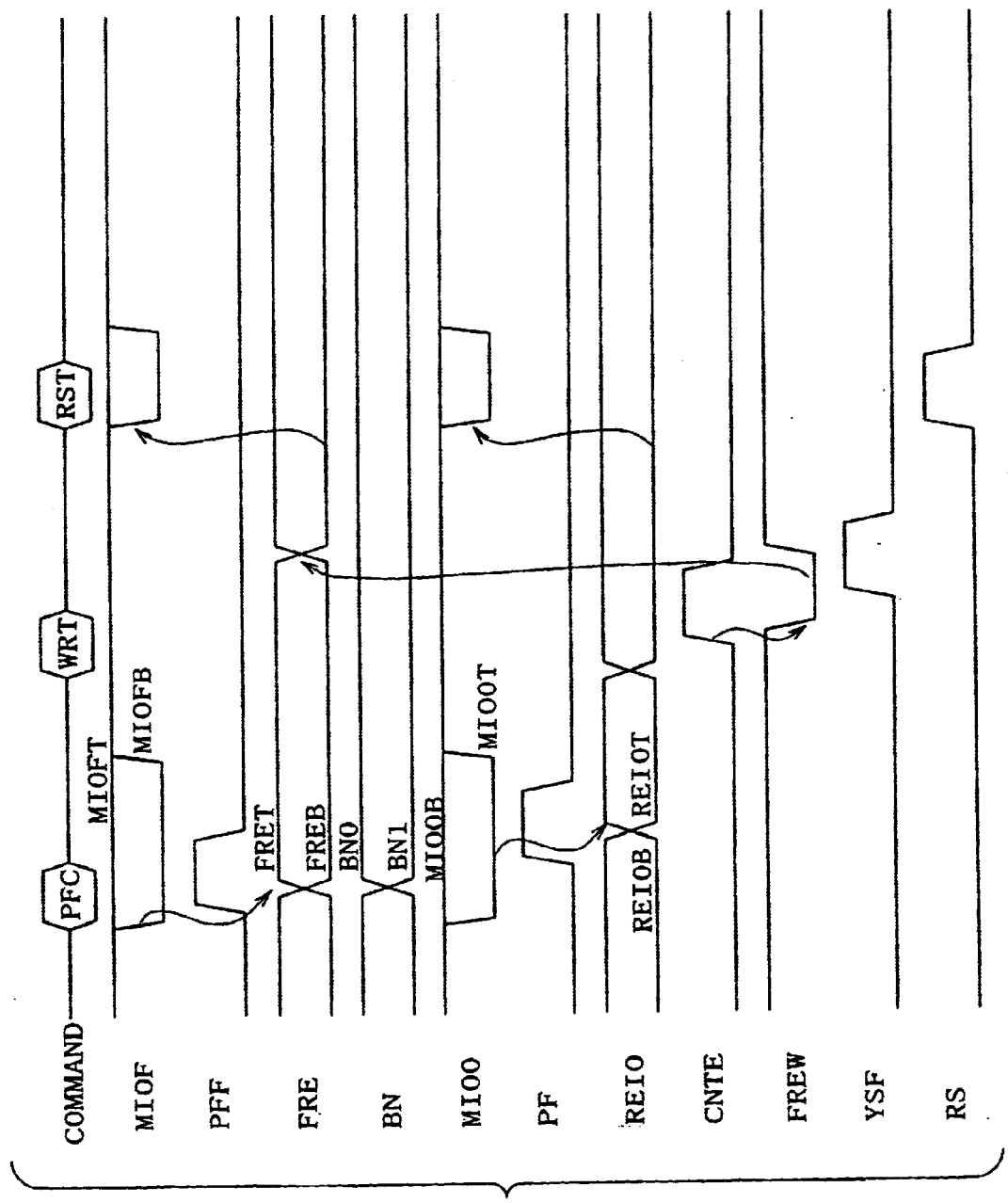
FIG. 6 shows waveforms relevant to functions performed by the encoder and encoding control circuits of FIG. 4 and FIG. 5, respectively.

FIG. 6 shows waveforms relevant to actions performed in the encoding control circuit ENCNTL. When a group of memory cells is selected based on a received Pre-fetch COMMAND PFC, data items are read from the sense amplifiers associated with the group of memory cells and placed on the data main input/output lines MIO0 (MIO0B, MIO0T) and the flag main input/output line MIOF (MIOFT, MIOFB), respectively.

The flag input clock PFF is activated first, and the data placed on the flag main input/output line MIOF is read into the flag register FRE. Moreover, the data placed on the group number register main input/output line MION is read into the group number register BN (BN0, BN1). Based on the flag, the encoders EN selects one of the polarities to be switched. Referring to FIG. 6, the flag recorded in the flag register FRE is set to a 1 (the node FRET is driven hand the node FREB is driven low). The data items on the data main input/output lines MIO are therefore inverted and read into the data registers RE. Referring to FIG. 6, the main input/output lines MIO0T and MIO0B and the data register input/output lines REIO (REIOT, REIOB) make a low-to-high or high-to-low transition.

The encoding control circuit ENCNTL receives a Write command WRT. Every time the contents of the data registers RE are rewritten, a counter-activating signal CNTE is activated. It is then determined whether the number of 1s or the number of 0s is larger. The flag column selection line YSF is then activated in order to update the flag recorded in the flag register FRE from terminal FREW. During restoring (RST), the data items in the data registers RE are inverted or non-inverted based on the flag recorded in the flag register FRE, and then placed on the main input/output lines MIO. At the same time, the flag in the flag register FRE is written in the associated sense amplifier and memory cell over the flag main input/output line MIOF. Restoring signal RS is also activated.

Second Exemplary Embodiment

Figure 7:
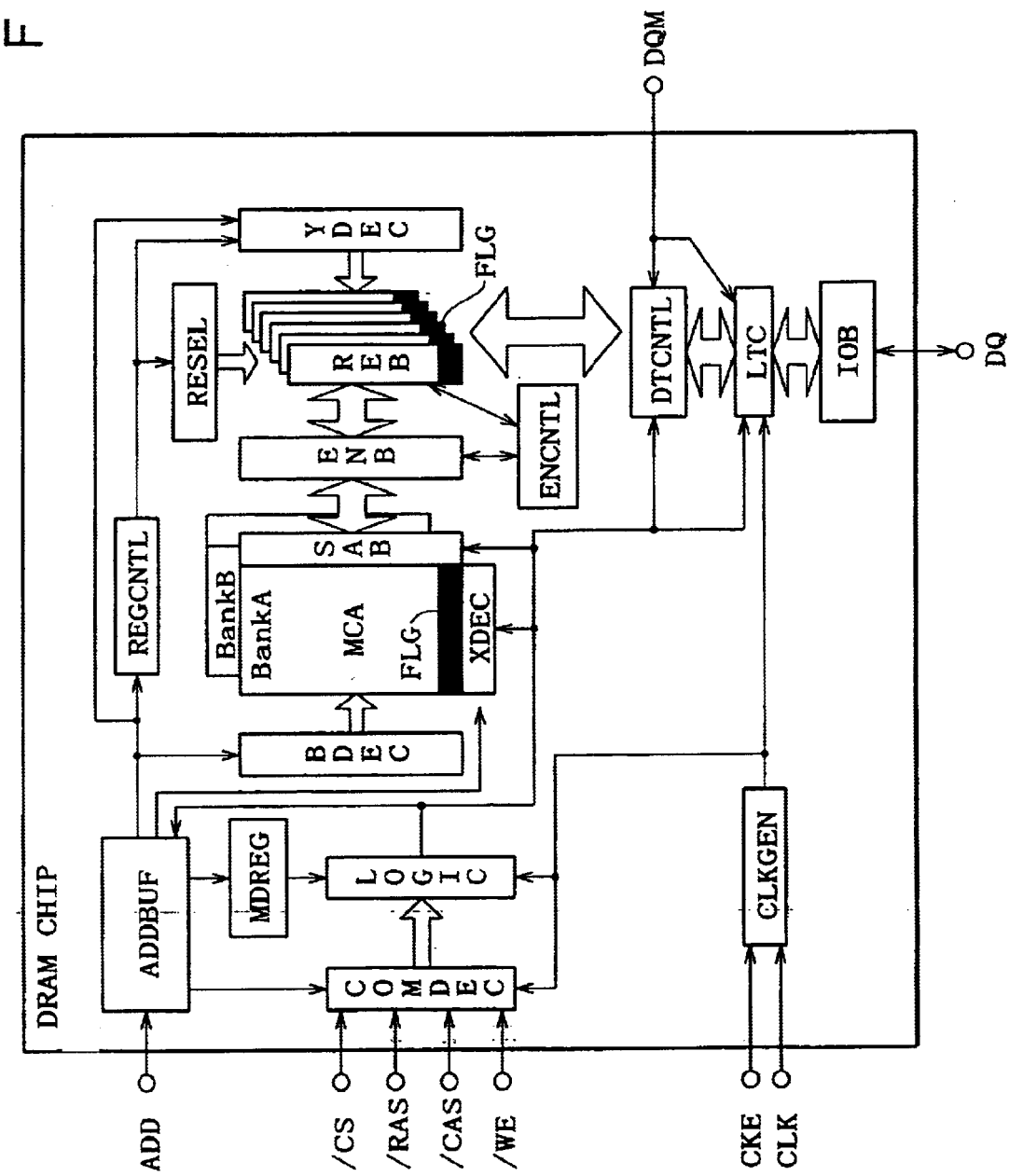
FIG. 7 is a circuit diagram of a register-incorporated DRAM of the present invention.

FIG. 7 shows an example of the circuitry of another preferred embodiment of the present invention comprising a register-incorporated DRAM. The actions to be performed in the DRAM of this preferred embodiment are described below. An address signal ADD is transmitted to an address buffer ADDBUF. A chip selecting signal /CS, a row address strobe signal /RAS, a column address strobe signal /CAS, and a writing enabling signal /WE are transmitted to a command decoder COMDEC. A clock CLK and a clock-enabling signal CKE are transmitted to a clock generator CLKGEN. The command decoder COMDEC decodes a received control signal and determines an operation mode by selecting any of a reading mode, a writing mode, and a pre-charging mode. A control logic LOGIC produces control signals required depending on the operation mode within a chip. A mode register MDREG holds a current operation mode. Register controller REGCNTL receives a signal from address buffer ADDBUF and controls the register selecting decoder RESEL.

When an Activate command is received, a row decoder XDEC activates a word line. Data items in a memory cell array MCA are amplified by a sense amplifier bank SAB and held therein. When a Pre-fetch command is received, part of the data items in the sense amplifier bank SAB is selected by a block decoder BDEC, and read into a data register bank REB, which is selected by a register selecting decoder RESEL, via an encoder bank ENB.

During restoring, data items are written from the data register bank REB into the sense amplifier bank SAB via the encoder bank ENB. Actions to be performed by the encoder bank ENB and encoding control circuit ENCTNL at this time are identical to those performed in the first preferred embodiment of the present invention. When a Read command is received, data items in the data registers RE are successively selected by a column decoder YDEC, transferred to an input/output buffer IOB via a data control circuit DTCNTL and a latch LTC, and then transmitted outside through an input/output terminal DQ. When a Write command is received, data items transferred from the input/output buffer IOB are written in a data register bank selected by the column decoder YDEC via the latch LTC and data control circuit DTCNTL. At this time, the data control circuit produces a data masking signal DQM in order to mask data.

When a plurality of data register banks is included in a chip, as shown in FIG. 7, the encoder bank ENB and encoding control circuit ENCNTL preferably are used in common. Such a configuration allows the area of the chip to be minimized compared with having an encoder bank and an encoding control circuit associated with each of the data register banks REB. Even when the encoder bank and encoding control circuit are used in common, pre-fetching, restoring, and writing are performed register by register and, therefore, a decrease in an operating speed will not occur.

Moreover, when the number of registers belonging to one data register bank REB is large, if data items placed on a plurality of word lines are simultaneously read into one register bank, data items placed on the same word line are grouped into a sub-block. The encoding described in conjunction with FIG. 1 is performed on each sub-block, and a flag memory cell (FLG) is created for each sub-block.

Third Exemplary Embodiment

Figure 8:
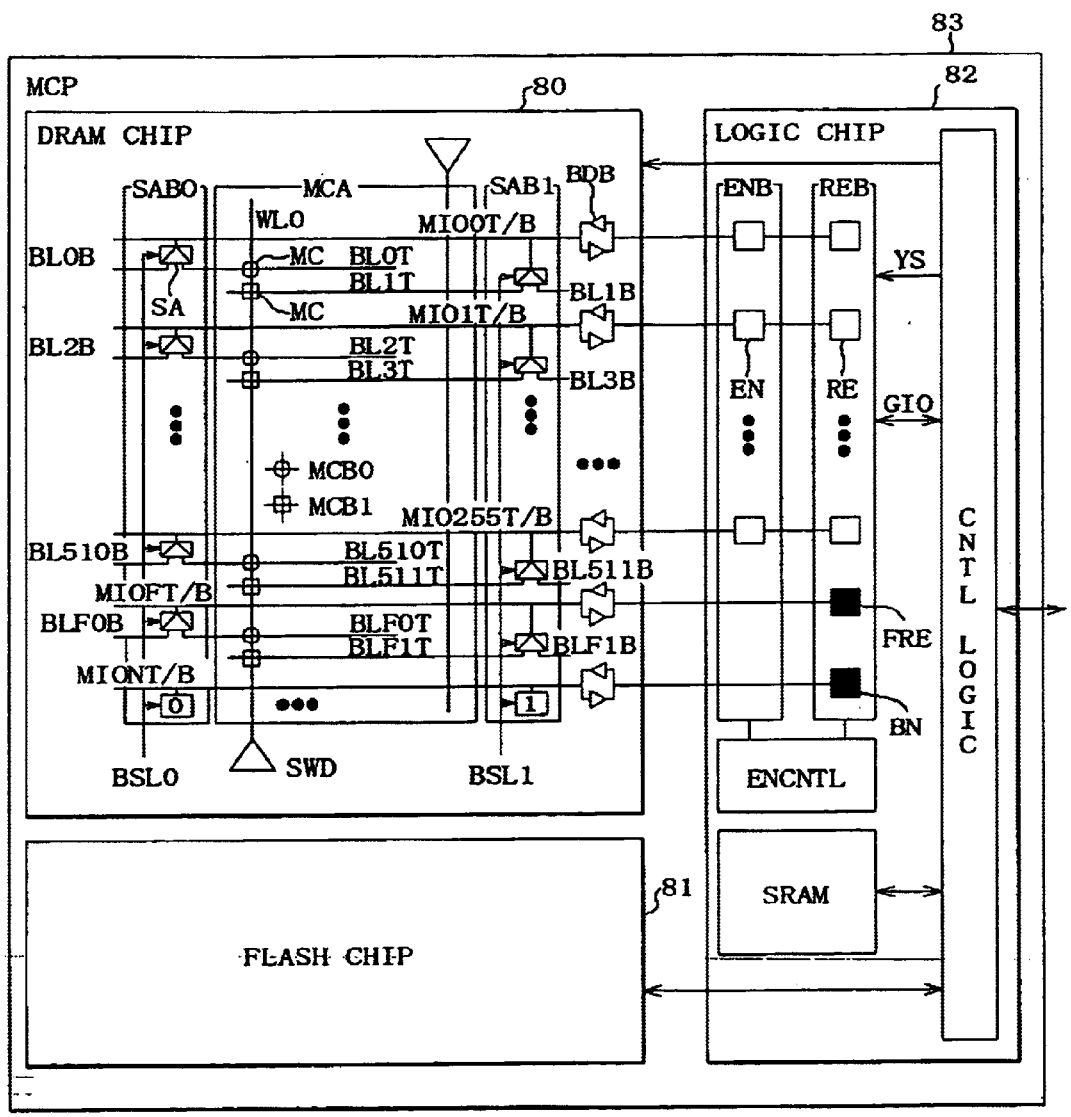
FIG. 8 is a circuit diagram of a multi-chip module of the present invention.
Figure 9A:
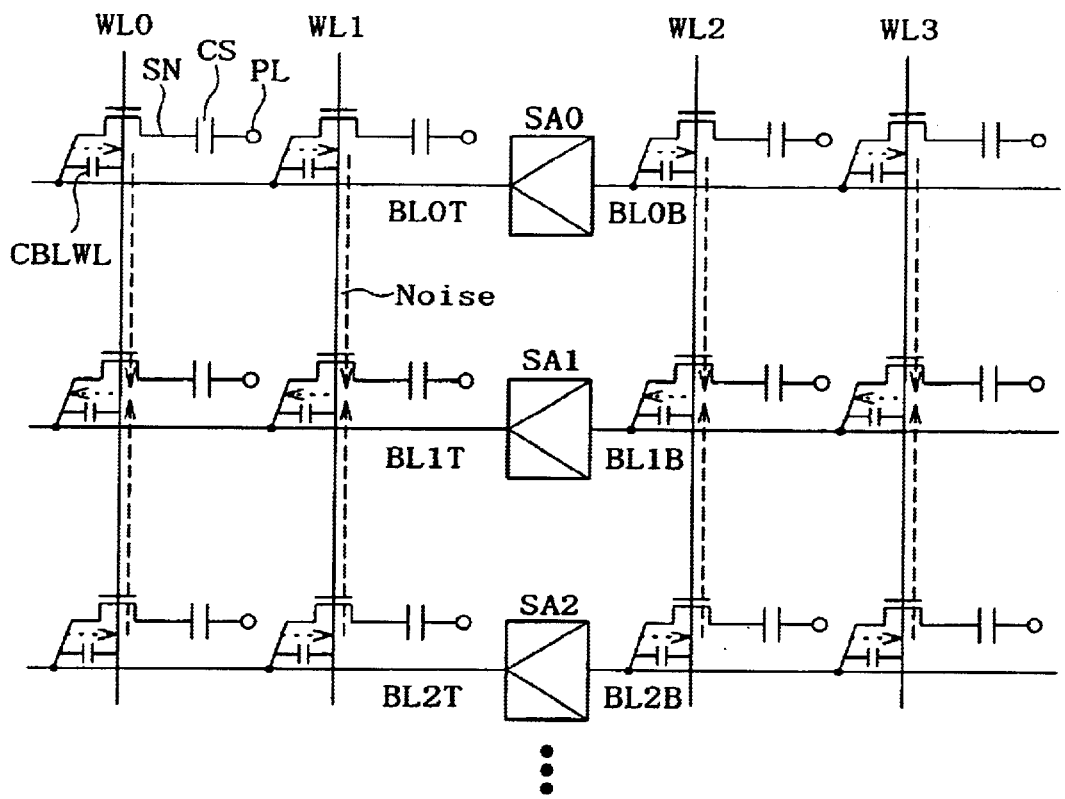
FIG. 9A is a circuit diagram showing a single intersection memory cell array having memory cells connected at all intersections of word lines and bit lines.
Figure 9B:
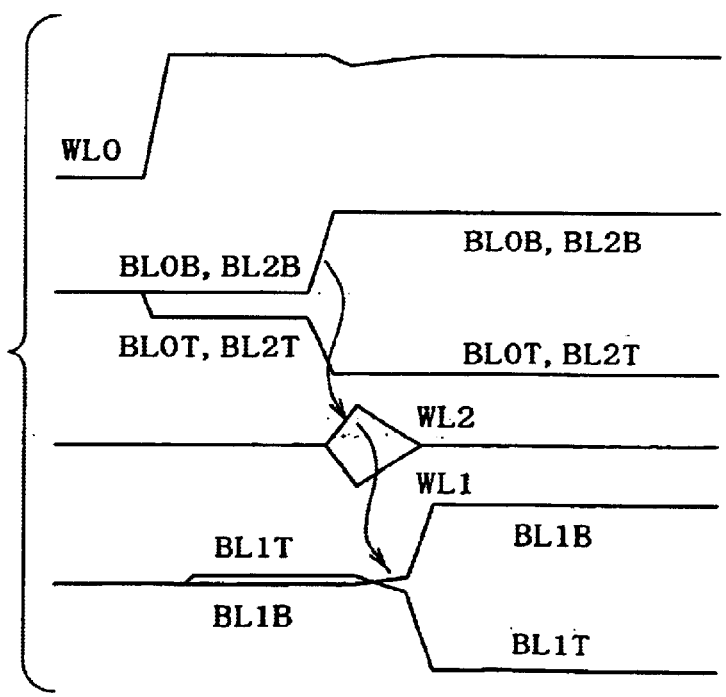
FIG. 9B shows the waveforms associated with the occurrence of one form of array noise comprising word line noise in a single-intersection memory cell array.
Figure 10:
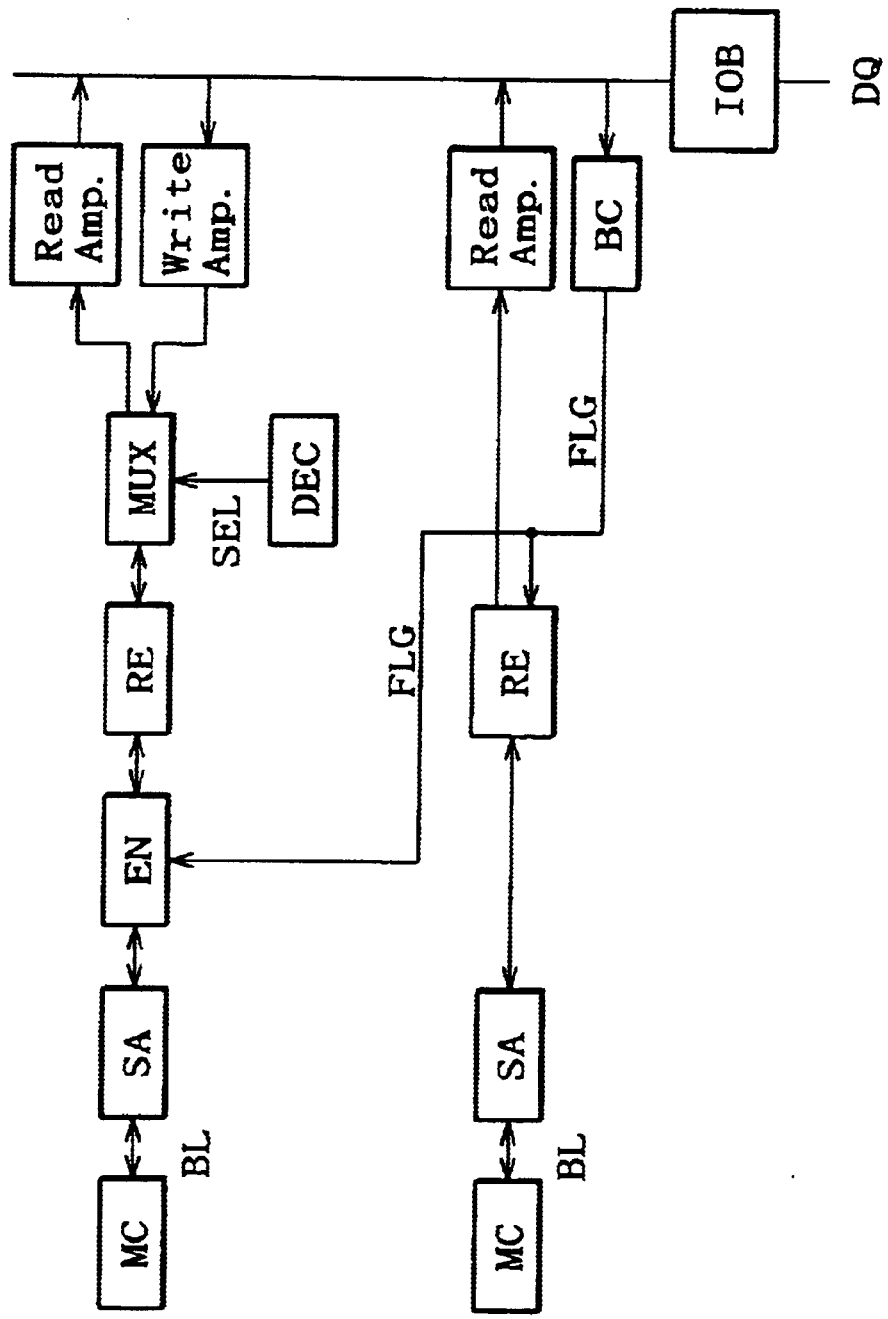
FIG. 10 is a schematic view of a conventional encoding DRAM.

FIG. 8 shows another preferred embodiment of the present invention comprising a multi-chip module MCP. A plurality of chips that are hard to be integrated into one chip, such as a DRAM chip 80, a flash memory chip 81, and a logic chip 82 are mounted on a silicon substrate 83, and interconnected using a silicon process. The number of connections is therefore much larger than the one on a normal printed-circuit board, but the area occupied by the mounted chips is reduced.

Consequently, the number of input/output pins formed on each chip can be increased. The DRAM chip 80 can transmit data items externally via a bi-directional buffer BDB over the main input/output lines MIO shown in FIG. 1. If the logic chip 82 includes the data register bank REB and encoder bank ENB, the DRAM chip 80 can be designed to have standard specifications. The specifications for the logic chip 82 can be modified. In this case, the DRAM chip 80 can be mass-produced since it can be adapted to work with a plurality of models of MCPs. Only the logic chip 82 is designed uniquely depending on the model. Thus, low-noise encoding can be realized without an increase in the cost of manufacture.

An SRAM and a flash memory may be included in the multi-chip module MCP so that programs can be stored in the flash memory and data can be held in the SRAM. The DRAM may be used as an image cache memory or a work memory for applications. This results in a memory system that has a large storage capacity and consumes little power during the standby state. This leads to extension of the operative time of portable equipment including portable telephones.

The preferred embodiments of the present invention have been described so far. The present invention is not limited to such preferred embodiments but can be designed in various manners within the spirit of the present invention. For example, the embodiments have been described with respect to a single-intersection memory cell array. Even when a dual-intersection memory cell array is adopted, if a difference between the capacitance levels of two parasitic capacitors formed among a word line and two complementary bit lines is so large that a noise cannot be canceled, the present invention will provide the same advantages as those described above. In such case where the dual-intersection memory cell array is adopted, data registers are accessible randomly, and flag memory cells, encoders, and an encoding control circuit are included, and a pattern of data items is encoded and decoded.

Even when the single-intersection memory cell array characterized by the minimized size of a memory cell and the minimized cost of manufacture is adopted, an array noise occurring during data reading and specific to the single-intersection memory cell array can be reduced 50% owing to the inclusion of a circuit for encoding a pattern of data items. The encoding is performed at the time of data transfer between data registers and a memory cell array. Thus, the increase in access time is minimized.

Moreover, the encoding performed in a semiconductor memory in accordance with the present invention requires the determination of whether the number of 1s among all of a plurality of bits wins a majority. The encoding is so simple that the circuit needed for the encoding is simplified. Eventually, both the time required for the encoding and the area occupied by the circuit needed for the encoding are minimized.

Furthermore, an encoding control circuit included in the semiconductor memory in accordance with the present invention is realized with an analog circuit in order to simultaneously compare a pattern of data items with a reference. Consequently, the pattern can be checked quickly.

The foregoing invention has been described in terms of preferred embodiments. However, those skilled in the art will recognize that many variations of such embodiments exist. Such variations are intended to be within the scope of the present invention and the appended claims.

Nothing in the above description is meant to limit the present invention to any specific materials, geometry, or orientation of parts. Many part/orientation substitutions are contemplated within the scope of the present invention. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A semiconductor memory comprising:

a plurality of memory cells wherein each of said plurality of memory cells is connected at one of a plurality of intersections between a plurality of word lines and a plurality of bit lines;

a one-bit flag memory cell included for each word line;

a plurality of sense amplifiers associated with said plurality of bit lines;

a plurality of data registers randomly accessible and holding writable data items; including a number of 1s and a number 0s;

an encoding control circuit for making a determination of a ratio of the number of 1s to the number of 0s among the writable data items; and encoders for writing the writable data items in said sense amplifiers as they are or by inverting the data items according to the ratio determined by said encoding control circuit.

2. A semiconductor memory according to claim 1, wherein:

said plurality of data registers constitutes a data register bank;

said plurality of memory cells interconnected over one word line is classified into a first group of memory cells and a second group of memory cells; and data items to be stored in the first group of memory cells or the second group of memory cells are recorded in said data register bank.

3. A semiconductor memory according to claim 2, wherein when the data items to be stored in said first group of memory cells are written from said data register bank into said sense amplifiers, said encoding control circuit extends control so that if the number of 0s exceeds the number of 1s in said data register bank, the data items will be written in said sense amplifiers as they are and a 0 will be written in said flag memory cell; and if the number of 1s exceeds the number of 0s, the data items will be inverted and written in said sense amplifiers and a 1 will be written in said flag memory cell.

4. A semiconductor memory according to claim 3, wherein when the data items to be stored in said second group of memory cells are written from said data register bank into said sense amplifiers, said encoding control circuit extends control so that if the number of 0s exceeds the number of 1s in said data register bank, the data items will be inverted and written in said sense amplifiers and a 1 will be written in said flag memory cell; and if the number of 1s exceeds the number of 0s, the data items will be written in said sense amplifiers as they are and a 0 will be written in said flag memory cell.

5. A semiconductor memory according to claim 4, wherein when data items are read from said sense amplifiers into said data register bank, the flag stored in said flag memory cell is read into a flag register; if the flag in said flag memory cell is reset to a 0, the data items are read into said data register bank as they are; and if the flag in said flag memory cell is set to a 1, the data items are inverted and read into said data register bank.

6. A semiconductor memory according to claim 5, wherein when data items read from said sense amplifiers are stored in said first group of memory cells, a 0 is written in a group number register; and when the data items are stored in said second group of memory cells, a 1 is written in said group number register.

7. A semiconductor memory according to claim 2, wherein:

said encoding control circuit comprises: a first group of NMOS transistors having the drains thereof connected to a first common drain terminal and having the sources thereof connected to a common source terminal; a second group of NMOS transistors having the drains thereof connected to a second common drain terminal and having the sources thereof connected to the common source terminal; a constant current source connected between the common source terminal and a ground; a first PMOS transistor having the source thereof connected onto a power line, having the drain thereof connected to the first common drain terminal, and having the gate thereof connected to the second common drain terminal; and a second PMOS transistor having the source thereof connected onto the power line, having the drain thereof connected to the second common drain terminal, and having the gate thereof connected to the first common drain terminal;

true value output terminals of the registers constituting said data register bank are connected to the gates of said first group of NMOS transistors; and false value output terminals of the registers constituting said data register bank are connected to the gates of said second group of NMOS transistors.

8. A semiconductor memory according to claim 7, wherein potentials at said first and second common drain terminals respectively, depend upon the number of 0s and 1s within said register bank.

9. A semiconductor memory according to claim 8, wherein the potential at said first common drain terminal is higher than the potential at said second common drain terminal when the number of 0s is larger than the number of 1s within said register bank.

10. A semiconductor memory according to claim 8, wherein the potential at said second common drain terminal is higher than the potential at said first common drain terminal when the number of 1s is larger than the number of 0s within said register bank.

11. A semiconductor memory according to claim 7, wherein said encoding control circuit transmits a 1 or 0 depending upon potentials at said first and second common drain terminals, respectively, and outputs applied to the first and second common drain terminals are inverted based on a value recorded in a group number register.

12. A semiconductor memory according to claim 8, wherein:

upon activation of a word line in response to an Activate command, data items are read from selected memory cells onto said bit lines, and said sense amplifiers amplify the data items;

said data items are transferred from said sense amplifiers to said data registers included in said data register bank in response to a Pre-fetch command;

the data items are read from said data registers in response to an external Read command;

data items are written in said data registers in response to an external Write command;

the data items in said data registers are written in said sense amplifiers in response to a Restore command;

in response to a Pre-charge command, the word line is reset and said bit lines are pre-charged;

during restoring, the data items in said data registers are encoded by said encoders according to the result of the determination made by said encoding control circuit, and written in said sense amplifiers; and during pre-fetching, the data items in said sense amplifiers are decoded by said encoders and read into said data registers.

13. A semiconductor memory according to claim 2, wherein each of said plurality of memory cells comprises one MOS transistor and one capacitor.

14. A semiconductor memory according to claim 13, wherein:

a first chip including said plurality of memory cells and said sense amplifiers, and a second chip including said data registers, said encoders, and said encoding control circuit are bonded to a silicon substrate; and said first chip and said second chip are linked by connections formed on said silicon substrate.

15. A semiconductor memory according to claim 14 further comprising a third chip, including a nonvolatile memory having information stored therein in proportion to a number of electrons accumulated at a floating gate, bonded to said silicon substrate and linked to said second chip by connections formed on said silicon substrate.

16. A semiconductor memory according to claim 1 wherein said plurality of memory cells is about equal to said plurality of intersections.

17. A semiconductor memory according to claim 5, wherein:

each of said data registers and said flag register comprises an inverter having input/output terminals connected to each other and a bi-directional buffer; and a writing signal to be applied to said data registers and a writing signal to be applied to said flag register are independent of each other.

18. A semiconductor memory according to claim 1 wherein said plurality of memory cells is equal to at about one-half of said plurality of intersections.

19. A semiconductor memory according to claim 1 wherein said plurality of memory cells is equal to one-half of said plurality of intersections.

20. A semiconductor memory according to claim 1 wherein said plurality of memory cells is equal to said plurality of intersections.

* * * * *